United States Patent
Yoshimura et al.

(10) Patent No.: US 9,455,125 B2
(45) Date of Patent: Sep. 27, 2016

(54) SUBSTRATE PROCESSING APPARATUS

(75) Inventors: Akihiro Yoshimura, Yamanishi (JP); Tetsuji Sato, Yamanashi (JP); Masato Horiguchi, Yamanashi (JP); Nobuhiro Wada, Yamanashi (JP); Makoto Kobayashi, Hsin-chu (TW); Hiroshi Tsujimoto, Yamanashi (JP); Jun Tamura, Yamanashi (JP); Mamoru Naoi, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 1069 days.

(21) Appl. No.: 13/070,115

(22) Filed: Mar. 23, 2011

(65) Prior Publication Data

US 2011/0240224 A1    Oct. 6, 2011

Related U.S. Application Data

(60) Provisional application No. 61/325,616, filed on Apr. 19, 2010.

(30) Foreign Application Priority Data

Mar. 24, 2010   (JP) ................................ 2010-068353

(51) Int. Cl.
| | |
|---|---|
| *C23C 16/00* | (2006.01) |
| *C23F 1/00* | (2006.01) |
| *H01L 21/306* | (2006.01) |
| *H01J 37/32* | (2006.01) |

(52) U.S. Cl.
CPC .... *H01J 37/32091* (2013.01); *H01J 37/32568* (2013.01)

(58) Field of Classification Search
USPC ............ 156/345.43–345.47, 345.33, 345.34; 118/723 E, 715; 315/111.21
See application file for complete search history.

(56) References Cited

U.S. PATENT DOCUMENTS

| | | | | |
|---|---|---|---|---|
| 6,221,221 | B1 * | 4/2001 | Al-Shaikh et al. ...... | 204/298.02 |
| 6,349,670 | B1 * | 2/2002 | Nakano et al. .......... | 156/345.47 |
| 7,375,946 | B2 * | 5/2008 | White et al. .................. | 361/234 |
| 8,519,724 | B2 * | 8/2013 | Kim ................... | G01R 27/2623 |
| | | | | 156/345.29 |
| 8,677,590 | B2 * | 3/2014 | Hudson et al. .......... | 156/345.47 |
| 2001/0027843 | A1 * | 10/2001 | Komino et al. ............. | 156/345 |
| 2002/0038688 | A1 * | 4/2002 | Nakano et al. ............... | 156/345 |

(Continued)

FOREIGN PATENT DOCUMENTS

| | | |
|---|---|---|
| JP | 02-046723 A | 2/1990 |
| JP | 06-333879 A | 12/1994 |

(Continued)

*Primary Examiner* — Rakesh Dhingra
(74) *Attorney, Agent, or Firm* — Abelman, Frayne & Schwab

(57) ABSTRACT

Disclosed is a substrate processing apparatus capable of suppressing generation of plasma in the space between a moving electrode and an end wall at one side of a cylindrical chamber. The substrate processing apparatus includes a cylindrical chamber to receive a wafer, a shower head movable along a central axis of the chamber inside the chamber, a susceptor opposing the shower head in the chamber, and a flexible bellows connecting the shower head to a cover of the chamber, wherein a high frequency power is applied to a processing space presented between the shower head and the susceptor, processing gas is introduced into the processing space, the shower head and the side wall of the chamber are non-contact to each other, and a bypass member is installed electrically connecting the shower head and the cover or the side wall of the chamber.

10 Claims, 7 Drawing Sheets

(56) References Cited

U.S. PATENT DOCUMENTS

| | | | |
|---|---|---|---|
| 2006/0081337 A1* | 4/2006 | Himori et al. | 156/345.47 |
| 2006/0191484 A1* | 8/2006 | Mitrovic et al. | 118/729 |
| 2008/0135177 A1* | 6/2008 | Kim | 156/345.43 |
| 2008/0182412 A1* | 7/2008 | Bailey, III | H01J 37/32366 438/689 |
| 2009/0200269 A1* | 8/2009 | Kadkhodayan et al. | 216/71 |

FOREIGN PATENT DOCUMENTS

| | | |
|---|---|---|
| JP | 10-079350 A | 3/1998 |
| JP | 11-251094 A | 9/1999 |
| JP | 2002-530857 A | 9/2002 |
| JP | 2008-274437 A | 11/2008 |
| TW | 511158 B | 11/2002 |
| TW | I301311 B | 9/2008 |
| WO | 03/003437 A1 | 1/2003 |

* cited by examiner

SUBSTRATE PROCESSING APPARATUS

CROSS-REFERENCE TO RELATED APPLICATIONS

This application is based on and claims priority from Japanese Patent Application No. 2010-068353, filed on Mar. 24, 2010, with the Japanese Patent Office, the disclosure of which is incorporated herein in its entirety by reference. Also, this application claims the benefit of U.S. Provisional Application No. 61/325,616 filed on Apr. 19, 2010, with the United States Patent and Trademark Office, which is herein incorporated by reference in its entirety.

TECHNICAL FIELD

The present disclosure relates to a substrate processing apparatus, and more particularly, to a substrate processing apparatus including an electrode movable in a processing chamber.

BACKGROUND

A substrate processing apparatus that performs a plasma processing on a semiconductor wafer (hereinafter, briefly referred to as a 'wafer') as a substrate includes a chamber capable of receiving the wafer and reducing an internal pressure, a mount (hereinafter, referred to as a 'susceptor') disposed at a bottom side in the chamber, and a shower head disposed to oppose the susceptor in the chamber. The susceptor serves as an electrode that is connected to a high frequency power supply and applies a high frequency power into the chamber while disposing the wafer. The shower head, which is grounded to serve as a ground electrode, introduces processing gas into the chamber. The substrate processing apparatus excites the processing gas supplied into the chamber by the high frequency power to generate plasma and performs the plasma processing on the wafer using the plasma.

However, in order to appropriately distribute the plasma in the chamber, in particular, in a space between the shower head and the susceptor, the substrate processing apparatus has been developed capable of controlling the distance of the processing space (hereinafter, referred to as a 'gap') between the shower head and the susceptor by configuring the susceptor in a movable state. See, for example, FIG. 1 disclosed in the Pamphlet of WO 2003/003437. In addition, the substrate processing apparatus has been considered recently configuring the shower head in a movable state rather than the susceptor due to a restriction of the layout around the substrate processing apparatus.

FIG. 11 is a cross-sectional view schematically showing the configuration of the substrate processing apparatus in which the shower head is configured to be movable.

In a substrate processing apparatus 100 of FIG. 11, a shower head 103 disposed to oppose a susceptor 102 in a cylindrical chamber 101 represents a substantial disk shape having an outer diameter that is substantially equal to an inner diameter of chamber 101, and vertically moves like a piston inside chamber 101 by a lift mechanism (not shown). In addition to shower head 103 that moves vertically, a flexible bellows 104 is interposed between shower head 103 and a ceiling wall 101a of chamber 101, and bellows 104 seals the inside of chamber 101 from external air. In addition, in FIG. 11, shower head 103 is represented by a solid line when it descends to the lowest position, and is represented by a dotted line when it ascends to the highest position.

SUMMARY

An exemplary embodiment of the present disclosure provides s substrate processing apparatus which comprises a cylindrical chamber configured to receive a substrate, a moving electrode configured to be movable along a central axis of the cylindrical chamber inside the cylindrical chamber, an opposing electrode configured to oppose the moving electrode in the cylindrical chamber, and a flexible barrier configured to connect the moving electrode to an end wall at one side of the cylindrical chamber. A high frequency power is applied to a processing space between the moving electrode and the opposing electrode, and a processing gas is introduced to the processing space, and the moving electrode and a side wall of the cylindrical chamber are a non-contact state, and a bypass member is installed to electrically contact the moving electrode to the side wall or the end wall at one side of the cylindrical chamber.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made, without departing from the spirit or scope of the subject matter presented here.

Figure 11:
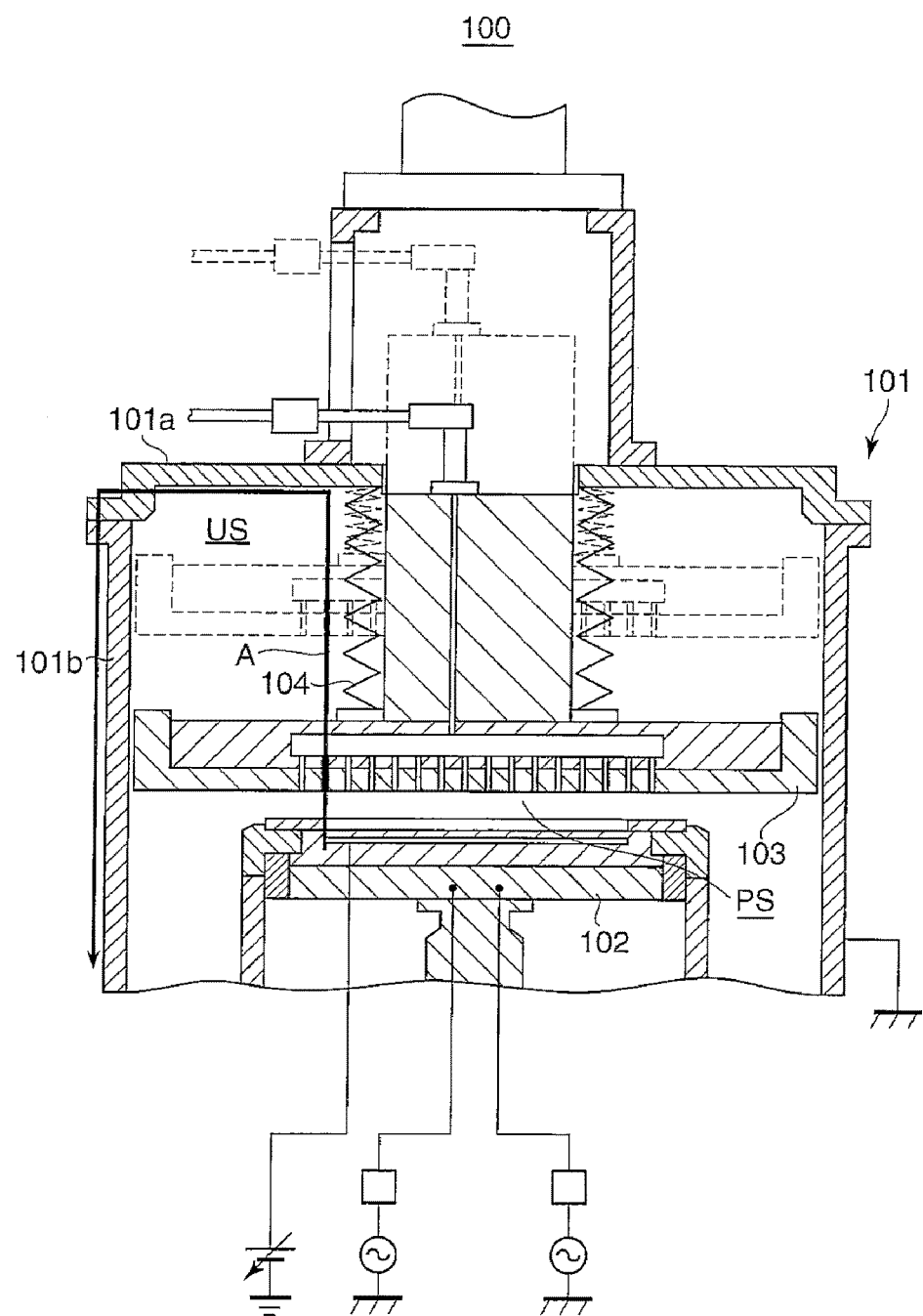
FIG. 11 is a cross-sectional view schematically showing the configuration of the substrate processing apparatus in which the shower head is configured to be movable.

In substrate processing apparatus 100, shower head 103 is configured to maintain an interval from side wall 101b to realize a smooth vertical movement, and to prevent the occurrence of particles caused by the rubbing of shower head 103 and side wall 101b of chamber 101. That is, since shower head 103 does not contact side wall 101b, neither DC current nor AC current flows into side wall 101b from shower head 103. As a result, in substrate processing apparatus 100, the high frequency current caused by the high frequency power applied to susceptor 102 sequentially flows to susceptor 102, a processing space PS, shower head 103, bellows 104, ceiling wall 101a of chamber 101, and side wall 101b of chamber 101, as shown by an arrow A of FIG. 11.

In this configuration, bellows 104 is made of, for example, stainless steel in consideration of durability, and, thus, has an impedance larger than that of other portions such as chamber 101 or shower head 103 made of aluminum. As a result, a potential difference is generated between shower head 103 and ceiling wall 101a of chamber 101 along bellows 104, and an electric field is generated in an upper space US presented between shower head 103 and ceiling wall 101a.

The electric field ionizes the processing gas entering into upper space US from processing space PS to generate plasma. The plasma generated in upper space US may dissipate the wall surface of chamber 101 or shower head 103, and may even cause a deposition, which is problematic.

The present disclosure has been made in an effort to provide a substrate processing apparatus capable of suppressing the occurrence of plasma in a space between the movable electrode and an end wall of one side of a cylindrical chamber.

In order to achieve the goals described above, an exemplary embodiment of the present disclosure provides a substrate processing apparatus which comprises a cylindrical chamber configured to receive a substrate, a moving electrode configured to be movable along a central axis of the cylindrical chamber inside the cylindrical chamber, an opposing electrode configured to oppose the moving electrode in the cylindrical chamber, and a flexible barrier configured to connect the moving electrode to an end wall at one side of the cylindrical chamber. A high frequency power is applied to a processing space between the moving electrode and the opposing electrode, and a processing gas is introduced to the processing space, and the moving electrode and a side wall of the cylindrical chamber are a non-contact state, and a bypass member is installed to electrically contact the moving electrode to the side wall or the end wall at one side of the cylindrical chamber.

In the substrate processing apparatus described above, the bypass member may be capable of being deformed according to the movement of the moving electrode. Also, a second connection end, separate from a first connection end with the moving electrode in the bypass member, may be connected to an outer peripheral portion of the end wall at one side of the cylindrical chamber.

In particular, a second connection end, separate from a first connection end with the moving electrode in the bypass member, may move while being sled to the side wall of the cylindrical chamber according to the movement of the moving electrode. Also, the bypass member represents a rectangular shape having a predetermined width, and a plurality of bypass members may be installed along the side wall of the cylindrical chamber with an equal space. Moreover, the bypass member may be an annular member which is concentric with the cylindrical chamber.

In the substrate processing apparatus, the bypass member may be formed with any one of an aluminum plate, a copper plate, a laminated plate (or an alloy plate) of titanium and aluminum, and a plate that an insulating coating is performed on the surfaces thereof. Also, the thickness of the bypass member may be at least two times larger than a skin depth of the bypass member, and the thickness of the bypass member may be 0.1 mm or less.

As set forth above, the exemplary embodiment of the present disclosure removes the potential difference between the moving electrode and the wall surface at one side of the cylindrical chamber, by mounting the bypass member electrically connecting the moving electrode and the side wall or the end wall at one side of the cylindrical chamber, to suppress the generation of electric field, such that the generation of the plasma may be suppressed in the space between the moving electrode and the end wall at one side of the cylindrical chamber.

Hereinafter, exemplary embodiments of the present disclosure will be described in detail with reference to the accompanying drawings.

Figure 1:
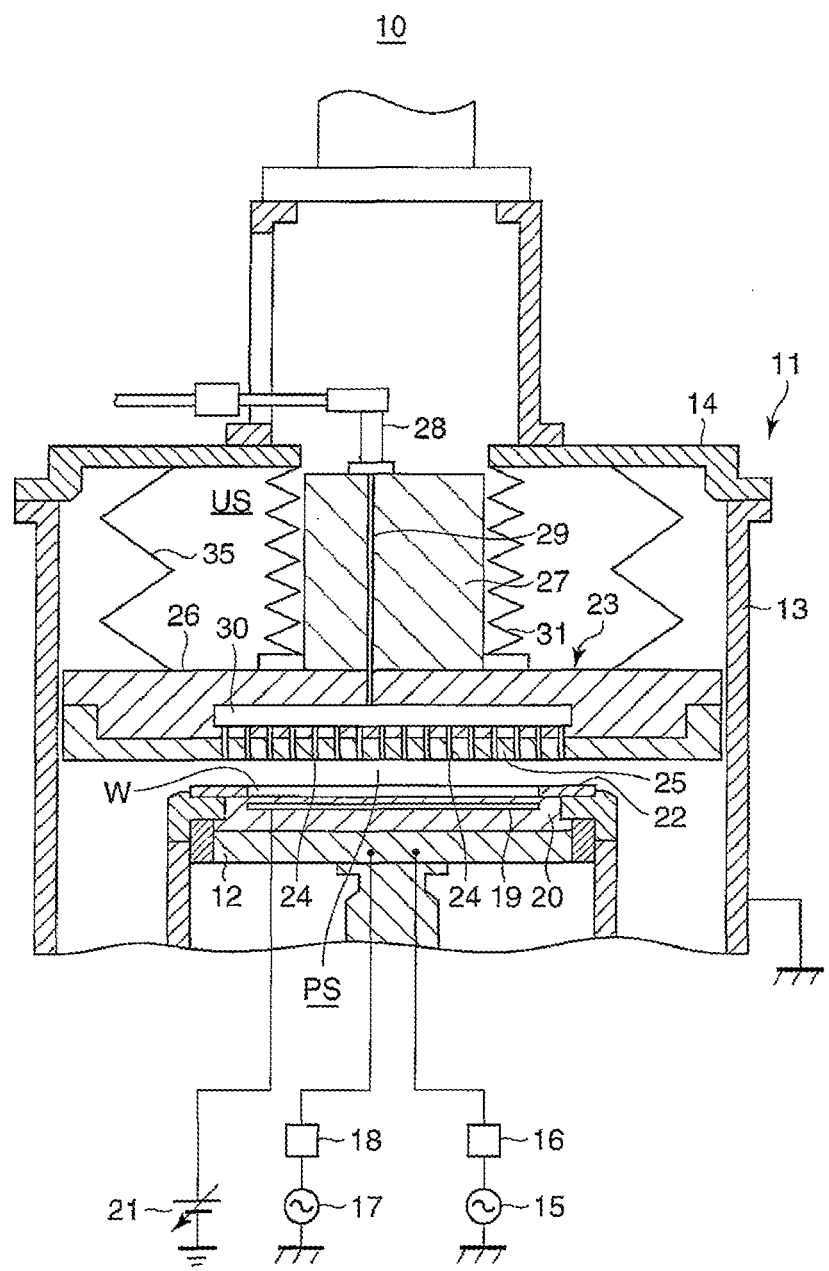
FIG. 1 is a cross-sectional view schematically showing the configuration of a substrate processing apparatus, according to an exemplary embodiment of the present disclosure.

FIG. 1 is a cross-sectional view schematically showing the configuration of a substrate processing apparatus, according to an exemplary embodiment of the present disclosure. The substrate processing apparatus is configured to perform dry etching processing on a wafer.

In FIG. 1, a substrate processing apparatus 10 includes a cylindrical chamber 11 (e.g., cylindrical container) receiving a wafer W having the diameter of, for example, 300 mm, and a disk-shaped susceptor 12 working as an opposing electrode disposing wafer W for a semiconductor device thereon, which is disposed at the bottom side of chamber 11 as represented by the drawing. Chamber 11 includes a circular pipe-shaped side wall 13, and a disk-shaped cover 14 which is an end wall at one side of the cylindrical chamber covering the end portion at a top side of side wall 13 as represented by the drawing.

The pressure in chamber 11 is reduced by, for example, a turbo molecular pump (TMP) (not shown) and a dry pump (DP) (not shown), and the pressure in chamber 11 is controlled by an APC valve (not shown).

A first high frequency power supply 15 is connected to susceptor 12 through a first rectifier 16, and a second high frequency power supply 17 is connected thereto through a second rectifier 18. First high frequency power supply 15 applies bias power which is a high frequency power of a relatively low frequency of, for example, 3.2 MHz, to susceptor 12, and second high frequency power supply 17 applies the power for generating plasma which is a high frequency power of a relative high frequency of, for example, 40 MHz, to susceptor 12. Further, susceptor 12 applies the power for generating plasma into chamber 11.

An electrostatic chuck 20 having an electrostatic electrode plate 19 provided therein is disposed on the top of susceptor 12. Electrostatic chuck 20 is made of a disk-shaped ceramic material and electrostatic electrode plate 19 is connected with a DC power supply 21. When a positive DC voltage is applied to electrostatic electrode plate 19, a negative potential is generated on a surface (hereinafter, referred to as a 'rear surface') of electrostatic chuck 20 side at wafer W to generate electric field between the electrostatic electrode plate 19 and the rear surface of wafer W. In this case, wafer W is absorbed and maintained into electrostatic chuck 20 by the Coulomb force or Johnsen-Rahbeck force generated by the electric field.

In addition, susceptor 12 is provided with a focus ring 22 that is a ring type member to surround wafer W that is absorbed and maintained into electrostatic chuck 20. Focus ring 22 may be made of a conductor, such as, for example, single crystal silicon, the same material as wafer W. Since focus ring 22 is made of the conductor, a density of plasma above the circumferential portion of wafer W is maintained to be substantially equal to the density of the plasma above the central portion of wafer W, by expanding the distribution area of plasma up to the top portions of wafer W as well as to focus ring 22. Therefore, the uniformity of dry etching processing performed on the entire surface of wafer W may be maintained.

Shower head 23 which is a movable electrode is provided at the top portion of chamber 11 opposing susceptor 12. Shower head 23 includes a disk-shaped insulating upper electrode plate 25 having a plurality of gas holes 24, a conductive cooling plate 26 removably hanging upper electrode plate 25, a shaft 27 hanging cooling plate 26, and a processing gas receiving part 28 disposed at the upper end of shaft 27. Upper electrode plate 25 may be made of quartz. Shower head 23 is grounded through cover 14 and side wall 13, and serves as the ground electrode for the plasma generating power applied to chamber 11.

Shaft 27 has a gas passage 29 vertically penetrating through the inside thereof as represented by the drawing, and cooling plate 26 has a buffer chamber 30 therein. Gas passage 29 connects processing gas receiving part 28 to buffer chamber 30, and each gas hole 24 communicates with the insides of buffer chamber 30 and of chamber 11. In shower head 23, gas hole 24, processing gas receiving part 28, gas passage 29, and buffer chamber 30 form a processing gas introduction system. And the processing gas introduction system introduces the processing gas supplied to processing gas receiving part 28 into chamber 11, in particular, into processing space PS presented between shower head 23 and susceptor 12.

In shower head 23, the outer diameter of upper electrode plate 25 is set to be slightly smaller than the inner diameter of chamber 11, such that shower head 23 does not contact side wall 13. That is, shower head 23 is disposed to be loosely coupled with chamber 11. In addition, shaft 27 penetrates through cover 14, and the upper portion of shaft 27 is connected to a lift mechanism (not shown) disposed above substrate processing apparatus 10. While the lift mechanism vertically moves shaft 27 in FIG. 1, shower head 23 vertically moves along the central axis of chamber 11 in chamber 11, like a piston. Therefore, a gap that is a distance of processing space PS between shower head 23 and susceptor 12 may be controlled. In addition, the maximum value of movement of shower head 23 in a vertical direction as represented by the drawings is, for example, 70 mm.

Since shaft 27 is likely to rub with cover 14 and this may be a source of an occurrence of particles, the side of shaft is covered with bellows 31. Bellows 31 is a flexible pressure barrier made of, for example, stainless material, and one end thereof is connected to the cover 14 and the other end thereof is connected to shower head 23. In addition, bellows 31 has a function of sealing the inside of chamber 11 against the outside of chamber 11.

In substrate processing apparatus 10, since shower head 23 does not contact side wall 13 of chamber 11, the high frequency current generated by the power for generating plasma applied to processing space PS, flows through shower head 23, and, then, reaches a ground after flowing through a space US (hereinafter, referred to as an 'upper space') between shower head 23 and cover 14, cover 14, and side wall 13. However, a potential difference may be generated between shower head 23 and cover 14 due to the large impedance of bellows 31, and the electric field may be generated in upper space US between shower head 23 and cover 14.

Accordingly, in the exemplary embodiment, a bypass member 35 is provided between shower head 23 and cover 14 which is the end wall of one side of chamber 11, electrically connecting shower head 23 and cover 14.

Figure 2:
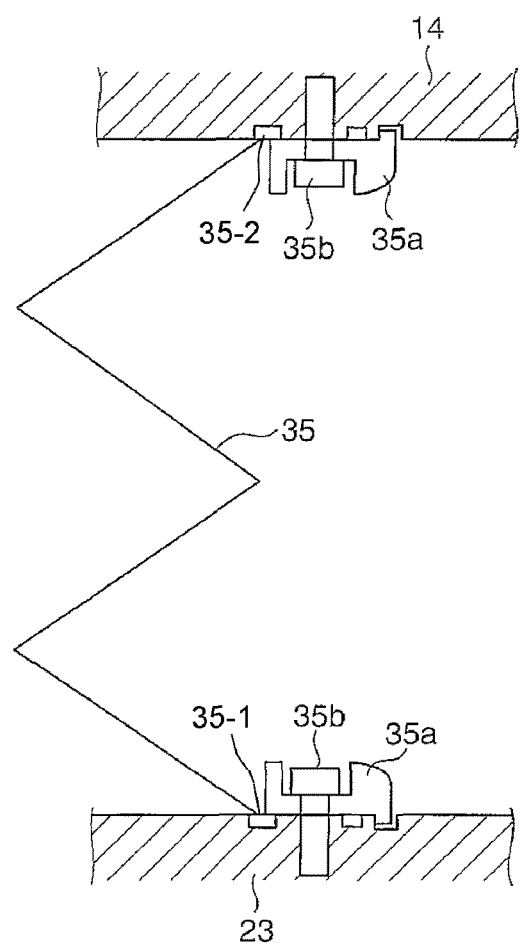
FIG. 2 is an enlarged cross-sectional view showing a bypass member in the substrate processing apparatus of FIG. 1.

FIG. 2 is an enlarged cross-sectional view showing bypass member 35 in the substrate processing apparatus of FIG. 1.

In FIG. 2, bypass member 35 may be configured to be deformed according to the movement of shower head 23. For example, bypass member 35 having a first connection end 35-1 and a second connection end 35-2 may be configured as a bellows formed by bending, for example, a rectangular shape aluminum thin plate. In bypass member 35, the connection with shower head 23 and the connection with cover 14 of chamber 11 are each screwed by a screw 35b through a plate member 35a made of, for example, alumite.

The width of the rectangular of bypass member 35 is, for example, 200 mm, and the number of mountains of the bellows is, for example, two (2) and the height of a mountain (depth dimension) is, for example, 35.4 mm. The number of mountains and the depth of mountain of the bellows are not specifically limited, and may be appropriately selected according to various factors such as the size of the substrate processing apparatus, the material of the bypass member, and the formability, etc. For example, six (6) sheets of bypass member 35 may be equally spaced in a circumferential direction along the side wall of chamber 11. Bypass member 35 is basically formed of a thin plate made of aluminum, and the thickness of the plate may be, for example, 0.08 mm which is two times larger than the skin depth flowing each of surfaces of bypass member 35.

The operation of components of substrate processing apparatus 10 having the above configuration, such as, for example, first high frequency power supply 15 or second high frequency power supply 17, is controlled by a CPU in a controller (not shown) provided in substrate processing apparatus 10, according to a program corresponding to the dry etching processing.

In substrate processing apparatus 10, the processing gas supplied to processing gas receiving part 28 is introduced into processing space PS through the processing gas introduction system, and the introduced processing gas is excited by the power for generating plasma applied to processing space PS, and becomes plasma. Cations in plasma are introduced to wafer W disposed on susceptor 12 by a negative bias potential caused by the bias power applied to susceptor 12, and the dry etching processing is performed on wafer W.

In addition, after the predetermined dry etching processing is completed, shower head 23 is moved by a predetermined amount, and, then, a gap suitable for a subsequent dry etching processing is selected, and the subsequent dry etching processing is performed on wafer W under the conditions suitable for the gap. In this case, bypass member 35 is deformed according to the movement of shower head 23 to remove the potential difference between shower head 23 and cover 14 of chamber 11.

According to the exemplary embodiment, since bypass member 35 is provided electrically connecting shower head 23 and cover 14 which is the end wall at one side of chamber 11, the high frequency power caused by the power for generating plasma applied to susceptor 12 may flow from shower head 23 into the ground through bypass member 35, rather than through bellows 31 having a large impedance. Therefore, the potential difference between shower head 23 and cover 14 of chamber 11 is removed, and the generation of electric field in upper space US between shower head 23 and cover 14 may be suppressed, such that the generation of plasma may be suppressed in upper space US.

Further, according to the exemplary embodiment of the present disclosure, since bypass member 35 is configured as the bellows that may be deformed according to the movement of shower head 23, shower head 23 may smoothly move without being restrained.

Furthermore, according to the exemplary embodiment of the present disclosure, a plurality of bypass members 35 are mounted at an equidistance in a circumferential direction along side wall 13 of chamber 11, such that the occurrence of a voltage unevenness may be suppressed in shower head 23. As a result, the plasma distribution may be uniform in processing space PS.

In the exemplary embodiment of the present disclosure, bypass member 35 may be configured of any one of an aluminum thin plate, a copper thin plate, a thin plate formed of a laminated plate (or an alloy plate) of titanium and aluminum, and either one of these thin plates the surface of which is performed with an insulating coating. These members have small impedance, and, thus, are suitable for bypass member 35. An example of the insulating coating material may include, for example, alumite, polyimide, polytetrafluoroethylene (PTFE), etc., and the insulating coating may be performed by forming these materials on the surface of bypass member 35. The occurrence of the leakage current may be prevented by performing the insulating coating.

In the exemplary embodiment of the present disclosure, the plate thickness of bypass member 35 is determined by the frequency of the high frequency power for generating plasma applied to susceptor 12. That is, since the plate thickness of bypass member 35 mainly prevents the interference between the high frequency current flowing the surface and the rear surface thereof, the plate thickness may be at least two times or more than the skin depth flowing each of the surfaces of bypass member 35.

The skin depth δ of bypass member 35 may be obtained according to the following equation 1.

$$\delta = \sqrt{\frac{2}{\omega \mu \sigma}} \ [m] \quad \text{[Equation 1]}$$

ω=angular frequency of current=2π×frequency (Hz)
μ=absolute permeability of conductor (H/m)
σ=electrical conductivity (S/m)

In this case, in the substrate processing apparatus to which the aluminum thin plate is applied as bypass member 35, when the frequency of the high frequency power for generating plasma is 40 MHz, the angular frequency 'ω' of current in bypass member 35 is 2π×40×10$^6$ (Hz), the absolute permeability 'μ' of aluminum is 1.26×10$^{-6}$ (H/m), and the electrical conductivity of aluminum 'σ' is 37.4×10$^6$ (S/m). Therefore, when the skin depth δ is obtained by substituting the forgoing values into the above Equation 1, δ is 0.013 mm. In this case, the plate thickness of bypass member 35 is 0.013×2=0.026 mm or more.

When the plate thickness of bypass member 35 becomes less than two times of the skin depth, the high frequency current flowing in the surface and the rear surface causes an interference. In addition, as the frequency of the high frequency power for generating plasma is increased, the skin depth δ becomes small, such that even though the frequency of the high frequency power for generating plasma is larger than 40 MHz, the plate thickness of bypass member 35 may be equal to the case where the frequency is 40 MHz. Even in this case, the high frequency current flowing in the surface and the rear surface does not interfere with each other.

In the exemplary embodiment of the present disclosure, as described above, the low bound value of the plate thickness of bypass member 35 is two times of the skin depth. Specifically, for example, when the highest frequency of the high frequency power for generating plasma in practical use is 100 MHz, the skin depth δ thereof is 0.008 mm from the above Equation 1, and the plate thickness of bypass member 35 is about 0.016 mm that is about two times of the skin depth. Meanwhile, when the lowest frequency of the high frequency power for generating plasma in practical use is 3 MHz, the skin depth δ obtained from the above Equation 1 based on the angular frequency 'ω' (2π×3×10$^6$ (Hz)) of the corresponding current is 0.047 mm, and the plate thickness of bypass member 35 becomes 0.1 mm that is about two times of the skin depth, which is set as an upper bound value of the plate thickness of bypass member 35.

The plate thickness of bypass member 35 may be appropriately determined in the above range considering, for example, the handling easiness and the lifespan, etc. In addition, bypass member 35 is not limited to one configured of a sheet of a rectangular shape thin plate, and two or more sheets of thin plates each having a predetermined thickness overlapping each other may be applied.

In the exemplary embodiment of the present disclosure, the connection in bypass member 35 with cover 14 of chamber 11 may be an outer circumferential portion near side wall 13. Therefore, since the path that shorts-cut the high frequency current flowing in the ground becomes short, the potential difference between shower head 23 and cover 14 of chamber 11 is efficiently reduced, thereby making it possible to prevent the generation of plasma in upper space US.

In the exemplary embodiment of the present disclosure, bypass member 35 not only bypasses the high frequency current caused by the power for generating plasma from shower head 23 to the ground through cover 14 of chamber 11, but also contributes to the change in a resonance frequency in the entire upper electrode by making the diameter of bellows 31 in an appearance large. In this case, the entire upper electrode indicates a concept including upper electrode plate 25, shower head 23 including upper electrode plate 25, upper space US, bellows 31, and side wall 13 of chamber 11 of substrate processing apparatus 10. In the entire upper electrode, the resonance frequency is changed, and the overlapping of the resonance frequency with the frequency (hereinafter, referred to as 'application frequency') of the applied power for generating plasma is avoided, such that the abnormal discharge and the generation of plasma are prevented in upper space US. As a result, the friction of the member and the deposition in upper space US may be prevented.

In substrate processing apparatus 10 of FIG. 1 of the present disclosure, upper electrode plate 25, shower head 23 including upper electrode plate 25, upper space US, bellows 31, and side wall 13 of chamber 11 are modeled and represented as an equivalent circuit. And the frequency characteristics are simulated in the equivalent circuit to obtain a condition in which the resonance frequency of the entire upper electrode does not overlap with the generally applied application frequency in substrate processing apparatus 10.

Hereinafter, the conditions will be described where the resonance frequency and the application frequency in the entire upper electrode do not overlap with each other.

Figure 3:
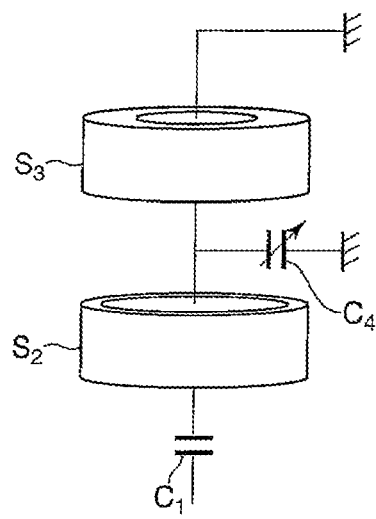
FIG. 3 is a diagram illustrating an equivalent circuit modeling an upper electrode, a shower head, an upper space, a bellows, and a side wall of the substrate processing apparatus of FIG. 1.

FIG. 3 is an equivalent circuit modeling upper electrode plate 25, shower head 23, upper space US, bellows 31, and side wall 13 in substrate processing apparatus 10 of FIG. 1. In FIG. 3, a capacitor $C_1$ based on the capacity of upper electrode plate 25, a coaxial structure $S_2$ using cooling plate 26 as an inner core, and a coaxial structure $S_3$ using bellows 31 as an inner core are connected in series. Also, a capacitor $C_4$ based on the capacity of upper space US is connected to coaxial structure $S_3$ in parallel.

Figure 4:
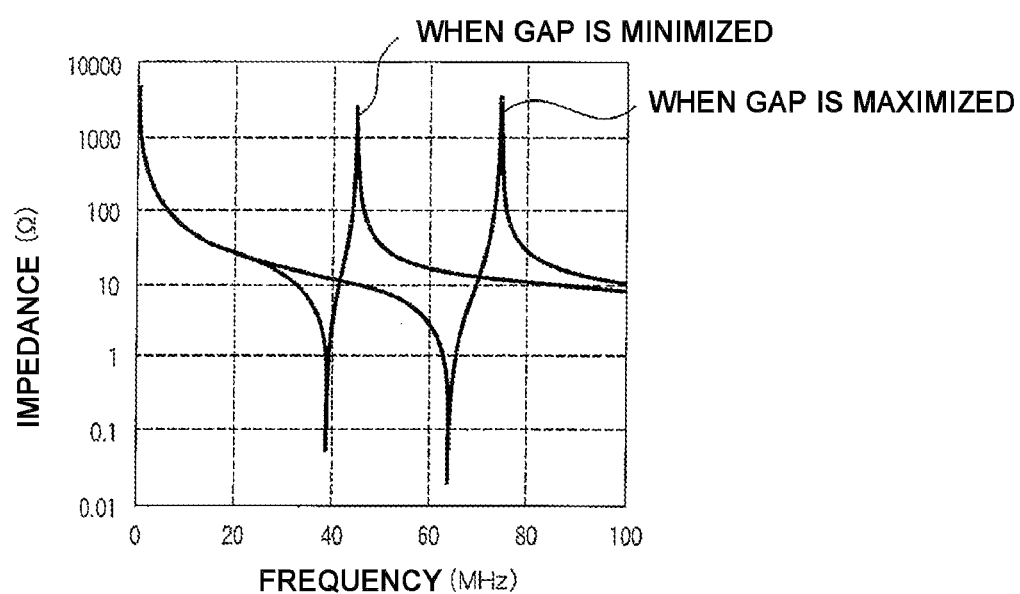
FIG. 4 is a graph showing the frequency characteristics of the impedance of the entire upper electrode in the equivalent circuit of FIG. 3.
Figure 5:
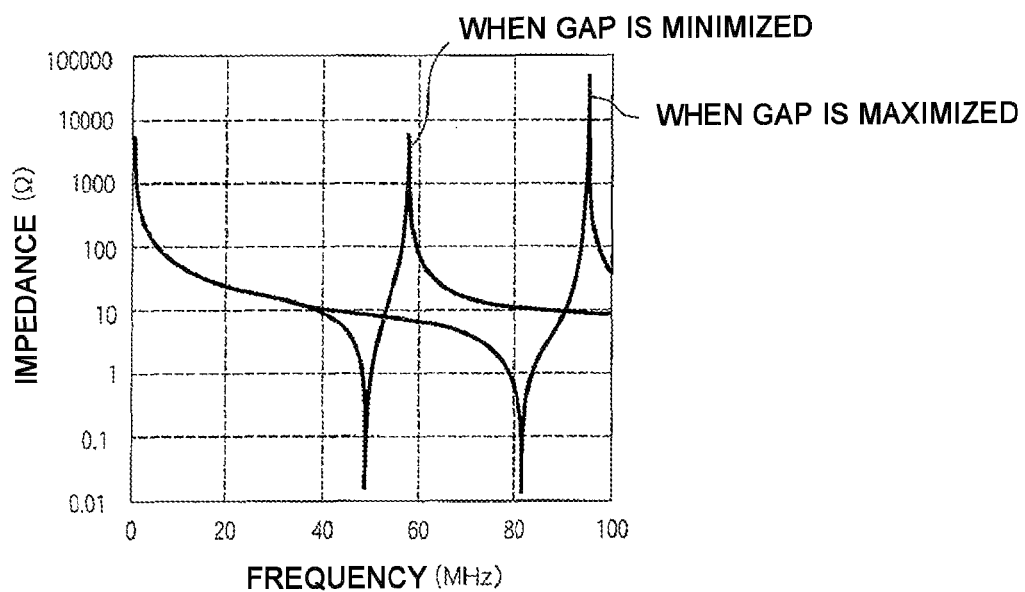
FIG. 5 is a graph corresponding to FIG. 4 and is a graph showing the frequency characteristics of the impedance of the entire upper electrode when a diameter of the bellows of the substrate processing apparatus is 370 mm.
Figure 6:
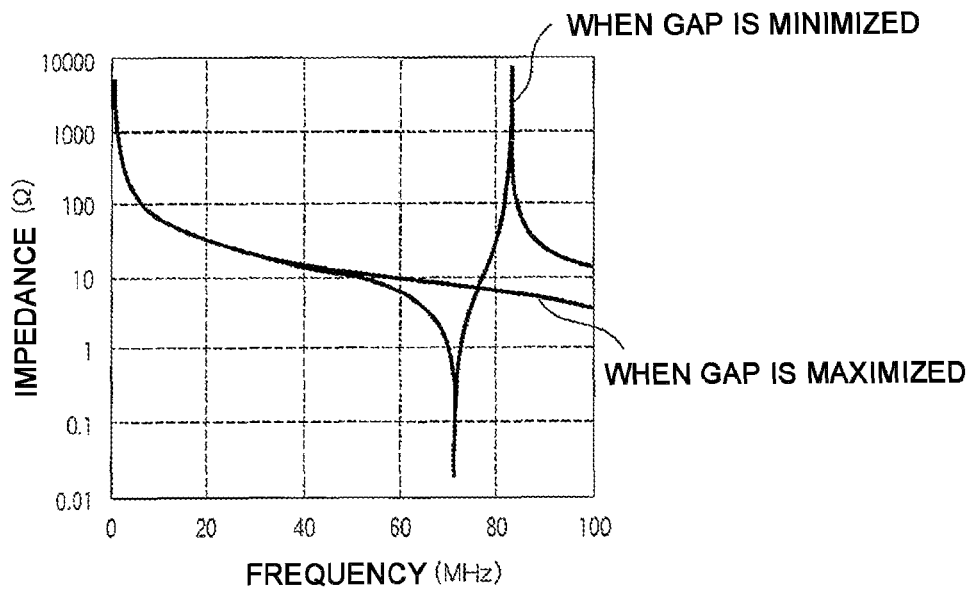
FIG. 6 is a graph corresponding to FIG. 4 and is a graph showing the frequency characteristics of the impedance of the entire upper electrode when a diameter of the bellows of the substrate processing apparatus is 470 mm.

In the equivalent circuit, the frequency characteristics of the impedance of the entire upper electrode where the diameter of bellows 31 in an appearance (see FIG. 1) is changed by installing bypass member 35, are simulated and obtained, and the results are represented in FIGS. 4 to 6.

FIGS. 4 to 6 are graphs each showing the frequency characteristics of the impedance of the entire upper electrode in the equivalent circuit of FIG. 3.

FIG. 4 shows a case in which the diameter (outer diameter) of bellows 31 is 270 mmϕ in substrate processing apparatus 10 of FIG. 1, as the case in which any specific measures are not performed. Meanwhile, FIG. 5 is a graph corresponding to FIG. 4, but in the case in which the diameter of bellows 31 of substrate processing apparatus 10 is increased to be 370 mmϕ in substrate processing apparatus 10 of FIG. 1. Specifically, the graph of FIG. 5 illustrates a case in which six (6) sheets of bypass members 35 are disposed at an equidistance on a circumference of a circle having a diameter of 370 mm and concentric with bellows 31, and, thus, the diameter of bellows 31 in an appearance is 370 mmϕ. In addition, FIG. 6 is a graph corresponding to FIG. 4, but in the case in which the diameter of the bellows of substrate processing apparatus 10 is increased to be 470 mmϕ in substrate processing apparatus 10 of FIG. 1. Specifically, the graph of FIG. 6 illustrates the case in which six (6) sheets of bypass members 35 are disposed at an equidistance on a circumference of a circle having a diameter of 470 mm and concentric with bellows 31, and, thus, the diameter of bellows 31 in an appearance is 470 mmϕ.

In FIG. 4, it is recognized that the resonance frequency of the entire upper electrode and the application frequency overlap with each other in the frequency characteristics of the impedance within the operable range of upper electrode 23. That is, when the gap is minimized, the resonance frequency of the entire upper electrode is located near 40 MHz, which overlaps with the application frequency that is generally used in substrate processing apparatus 10. Therefore, this is the cause of generating the abnormal discharge. Meanwhile, when the gap is maximized, the resonance frequency is located near 70 MHz.

In connection with this, in FIG. 5 where the diameter of bellows 31 is increased up to 370 mmϕ, the resonance frequency moves to about 50 to 55 MHz when the gap is minimized, and the overlapping with the application frequency (for example, 40 MHz) is eliminated. When the gap is maximized, the resonance frequency moves to about 90 MHz. Further, in FIG. 6 where the diameter of bellows 31 is increased up to 470 mmϕ, the resonance frequency moves to about 80 MHz when the gap is minimized, and the overlapping with the application frequency (for example, 40 MHz) is eliminated. It is considered that the resonance frequency is not represented on a graph when the gap is maximized, and moves to a portion of 100 MHz or more.

From this, generally, in substrate processing apparatus 10 of FIG. 1 where the high frequency power of 40 MHz is applied as the application frequency, the abnormal discharge and the generation of plasma in upper space US are avoided. Therefore, in order to prevent the friction of the member and the deposition in upper space US, it is effective that the diameter of bellows 31 may be increased, and, thus, the resonance frequency of the entire upper electrode may move to the high frequency side, so as not to overlap with the application frequency. In addition, it is considered that the phenomenon that the resonance frequency of the entire upper electrode moves to the high frequency side by increasing the diameter of bellows 31 is not unique in the frequency band shown in FIGS. 4 to 6, and is generally recognized even in a case where the frequency band is changed to the other frequencies.

In addition, in substrate processing apparatus 10 of FIG. 1, when using the high frequency power of, for example, 100 MHz as the application frequency, since the resonance frequency and the application frequency do not overlap with each other within the operable range of upper electrode 23 (see FIG. 4), special measures for moving the resonance frequency are not needed.

In the exemplary embodiment of the present disclosure, although the plurality of rectangular shape bellows installed at equidistance in the circumferential direction along wall surface 13 of chamber 11 are used as bypass member 35, the exemplary embodiment is not limited thereto. Bypass member 35 may be an annular member covering the entire inner circumference of chamber 11, and, in addition to a bellows type, the annular member may be a cross section arc type, a cross section semicircular type, a curved type having cross section ruggedness, and other types, which are described later. Therefore, the generation of the voltage unevenness at the surface of shower head 23 may be suppressed, and, thus, the uniformity of the plasma distribution may be improved within processing space PS, and, further, the uniformity of an etching rate may be improved. In addition, bypass member 35 is different from bellows 31 which serves as a pressure barrier that isolates air from the inside of chamber 11, and does not require rigidity. Therefore, a thin plate type member, a thin film type member, or a flat type member may be applied.

In the exemplary embodiment of the present disclosure, although bypass member 35 is provided to connect shower head 23 to end wall 14 of chamber 11, the bypass member may connect shower head 23 to side wall 13 of chamber 11 instead.

In the exemplary embodiment of the present disclosure, a ring type dielectric member may be interposed between shower head 23 and side wall 13 of chamber 11. Therefore, a ground pass capacity ratio flowing in the ground through bypass member 35 is increased, thereby increasing the effect according to the installation of bypass member 35. Since the dielectric member is exposed to plasma generated in processing space PS, the configuration material of the dielectric member needs to have a tolerance against radical and ion sputter. Further, a ceramic-based material such as alumina ceramic, aluminum nitride, silicon nitride, yttrium oxide (Y$_2$O$_3$), sapphire, zirconia, or quartz may be used. However, a member covered with an insulating resin such as polytetrafluoroethylene or engineering plastic-based resin as a plasma-resistant coating may also be used. In addition, the dielectric constant of the ring type dielectric member may be about 2 to 30.

In addition, a capacitor layer made of a low dielectric material may be provided on each of the opposing surface of shower head 23 that opposes upper space US and the opposing surface of cover 14 that opposes the upper space US. As a result, the voltage drop value becomes small in upper space US, thereby making it possible to more effectively prevent the generation of plasma within upper space US.

Next, a modified example of the bypass member in the substrate processing apparatus according to the exemplary embodiment of the present disclosure will be described.

Figure 7:
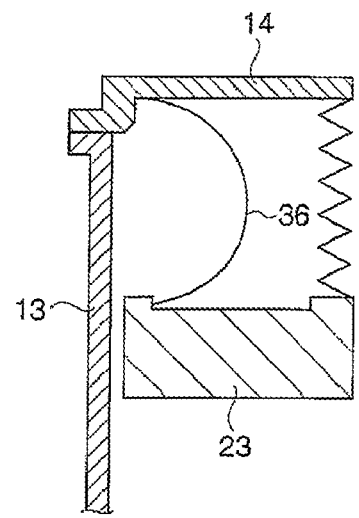
FIG. 7 is a cross-sectional view schematically showing the configuration of a modified example of the bypass member in the substrate processing apparatus of FIG. 1.
Figure 8:
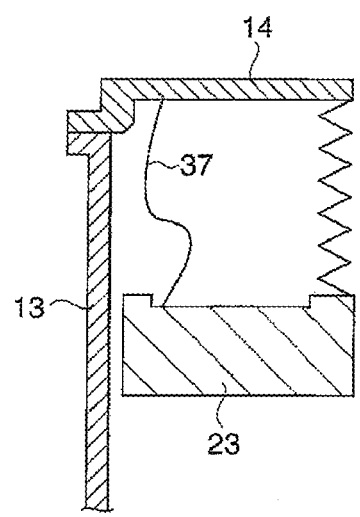
FIG. 8 is a cross-sectional view schematically showing the configuration of another modified example of the bypass member in the substrate processing apparatus of FIG. 1.
Figure 9:
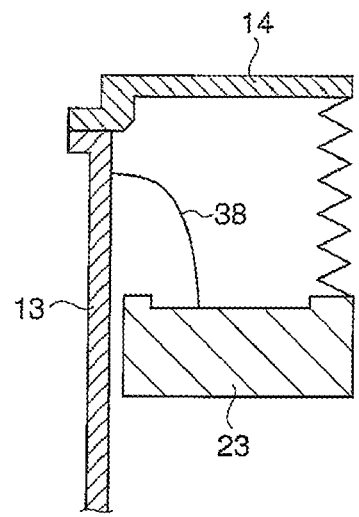
FIG. 9 is a cross-sectional view schematically showing the configuration of a separate modified example of the bypass member in the substrate processing apparatus of FIG. 1.

FIGS. 7 to 9 are cross-sectional views each schematically showing the configuration of a modified example of a bypass member in the substrate processing apparatus of FIG. 1.

The substrate processing apparatus of FIG. 7 makes the cross section shape according to the longitudinal direction of rectangular shape bypass member 36 into a semicircular shape. In addition, the substrate processing apparatus of FIG. 8 makes the cross section shape according to the longitudinal direction of rectangular shape bypass member 37 into a curved shape having a rugged portion. In addition, the substrate processing apparatus of FIG. 9 makes the cross section shape according to the longitudinal direction of rectangular shape bypass member 38 into an arc type, and connects a second connection end separate from a first connection end associated with shower head 23 of arc-type bypass member 38, to side wall 13 of chamber 11.

The modified example according to the exemplary embodiments shown in FIGS. 7 to 9 is the same as the substrate processing apparatus shown in FIGS. 1 and 2, and eliminates the potential difference between shower head 23 and cover 14 of chamber 11 to suppress the generation of the electric field in upper space US, thereby suppressing the generation of plasma in upper space US.

Figure 10:
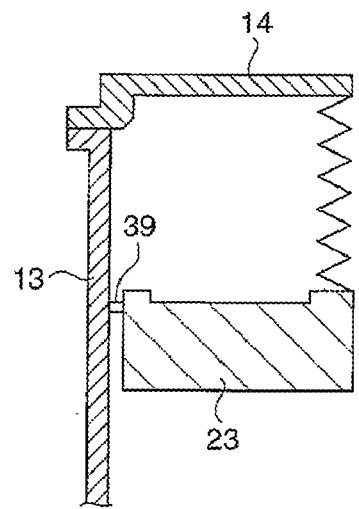
FIG. 10 is a cross-sectional view schematically showing the configuration of another modified example of the bypass member in the substrate processing apparatus of FIG. 1.

FIG. 10 is a partial cross-sectional view schematically showing the configuration of another modified example of the bypass member in the substrate processing apparatus of FIG. 1.

In the substrate processing apparatus of FIG. 10, only one end of bypass member 39 is fixed to shower head 23, and the other end thereof is neither fixed to cover 14 nor fixed to side wall 13 of chamber 11. The other end of bypass member 39 moves while being sled to side wall 13 of chamber 11 according to the movement of shower head 23.

According to the modified example of the exemplary embodiment of the present disclosure, similar to each exemplary embodiment, the potential difference between shower head 23 and cover 14 of chamber 11 is eliminated, thereby suppressing the generation of the electric field in upper space US.

In addition, according to the modified example of the exemplary embodiment of the present disclosure, instead of the member deformed according to the movement of shower head 23, for example, a rigid member may be applied as the bypass member, expanding the choice of the bypass member.

In the modified example of the exemplary embodiment of the present disclosure, the connection between bypass member 39 and shower head 23 may be provided with a spring member pressing bypass member 39 to side wall 13 of chamber 11. Therefore, the high frequency current caused by the high frequency power for generating plasma may effectively flow in the ground direction.

In each of the above-mentioned exemplary embodiments, although the case is described in which shower head 23 moves and the gap is presented between shower head 23 and side wall 13 of chamber 11, the present disclosure is not limited thereto, and, therefore, may be similarly applied to the apparatus in which susceptor 12 moves and the gap is presented between susceptor 12 and side wall 13 of chamber 11.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A plasma processing apparatus for processing a substrate, comprising:
a cylindrical chamber configured to receive a substrate;
a moving electrode including a shower head and serving as an upper electrode configured to be movable along a central axis of the cylindrical chamber inside the cylindrical chamber, the moving electrode being in a non-contact state with a side wall of the cylindrical chamber;
an opposing electrode configured to oppose the moving electrode in the cylindrical chamber;
a flexible barrier configured to connect the moving electrode to a top wall at one side of the cylindrical chamber in order to enclose a shaft provided on the moving electrode; and
a bypass member including a bellows made of a conductive material configured to be deformed according to a movement of the moving electrode and installed to directly connect the moving electrode to the top wall at one side of the cylindrical chamber so as to remove a potential difference between the moving electrode and either one of the side wall or the top wall of the cylindrical chamber,
wherein a high frequency power is applied to the opposing electrode and a processing gas is introduced to a processing space between the moving electrode and the opposing electrode, and
the bypass member is disposed on a circumference of a circle having a predetermined diameter, the bypass member being concentric with and surrounding the flexible barrier such that a resonant frequency of the entire moving electrode including the flexible barrier has a value that is controlled not to be overlapped with a frequency of the applied power for generating plasma within an operable range of the moving electrode.

2. The substrate plasma processing apparatus of claim 1, wherein the bypass member has a first connection end and a second connection end, and the second connection end separate from the first connection end with the moving electrode, is connected to an outer peripheral portion of the end top wall at one side of the cylindrical chamber.

3. The plasma processing apparatus of claim 1, wherein the bypass member is an annular member which is concentric with the cylindrical chamber.

4. The plasma processing apparatus of claim 1, wherein the bypass member is formed with any one of an aluminum plate, a copper plate, a laminated plate of titanium and aluminum, and a plate that an insulating coating is performed on the surfaces thereof.

5. The plasma processing apparatus of claim 1, wherein the thickness of the bypass member is at least two times larger than a skin depth of the bypass member.

6. The plasma processing apparatus of claim 5, wherein the thickness of the bypass member is 0.1 mm or less.

7. The plasma processing apparatus of claim 1, wherein a ring type dielectric member is disposed between the moving electrode and the side wall of the cylindrical chamber.

8. The plasma processing apparatus of claim 1, wherein a connection with the top wall of the cylindrical chamber in the bypass member is an outer circumferential portion near the side wall of the cylindrical chamber.

9. The plasma processing apparatus of claim 1, wherein a capacitor layer made of a low dielectric material is provided on each of a facing surface of the moving electrode configured to face an upper space between the moving electrode and the top wall of the cylindrical chamber, and a facing surface of the top wall of the cylindrical chamber which is configured to face the upper space.

10. The plasma processing apparatus of claim 1, wherein a cross section shape according to a longitudinal direction of the bypass member is one of a semicircular shape, a curved shape having a rugged portion, and an arc type.

* * * * *